US008627219B2

(12) United States Patent
Wang et al.

(10) Patent No.: US 8,627,219 B2
(45) Date of Patent: Jan. 7, 2014

(54) EQUIPMENT WITH DUAL SCREENS FOR CONTROLLING MULTI-COMPUTERS AND THE OPERATING METHOD THEREOF

(75) Inventors: Wen-hung Wang, Keelung (TW); Kuo Feng Kao, New Taipei (TW)

(73) Assignee: Aten International Co., Ltd., Shijr (TW)

( * ) Notice: Subject to any disclaimer, the term of this patent is extended or adjusted under 35 U.S.C. 154(b) by 316 days.

(21) Appl. No.: 13/042,474

(22) Filed: Mar. 8, 2011

(65) Prior Publication Data

US 2011/0225537 A1 Sep. 15, 2011

(30) Foreign Application Priority Data

Mar. 10, 2010 (TW) .............................. 99107017 A

(51) Int. Cl.
*G06F 3/00* (2006.01)
*G06F 15/16* (2006.01)

(52) U.S. Cl.
USPC ........... 715/762; 715/763; 715/764; 715/744; 715/771; 709/217; 709/218; 709/219

(58) Field of Classification Search
USPC ........... 715/762–765, 744, 771; 719/217–219
See application file for complete search history.

(56) References Cited

U.S. PATENT DOCUMENTS

| 7,578,742 | B2 | 8/2009 | Miyamoto et al. | |
|---|---|---|---|---|
| 2006/0232917 | A1* | 10/2006 | Wu et al. | 361/681 |
| 2006/0289370 | A1* | 12/2006 | Shih | 211/26 |
| 2007/0121302 | A1* | 5/2007 | Lee | 361/726 |
| 2008/0126629 | A1 | 5/2008 | Huang | |
| 2008/0284300 | A1 | 11/2008 | Wu et al. | |
| 2009/0063732 | A1* | 3/2009 | Hayama | 710/36 |
| 2009/0094305 | A1* | 4/2009 | Johnson | 708/403 |
| 2009/0164930 | A1 | 6/2009 | Chen et al. | |
| 2009/0190293 | A1* | 7/2009 | Shih et al. | 361/679.02 |
| 2009/0265412 | A1* | 10/2009 | Hainzer | 709/200 |
| 2010/0060571 | A1 | 3/2010 | Chen et al. | |
| 2010/0063222 | A1* | 3/2010 | Oikawa et al. | 525/474 |
| 2010/0097326 | A1* | 4/2010 | Liang | 345/173 |
| 2011/0113166 | A1* | 5/2011 | Hung et al. | 710/63 |
| 2012/0278759 | A1* | 11/2012 | Curl et al. | 715/804 |

FOREIGN PATENT DOCUMENTS

| CN | 101430620 | 5/2009 |
|---|---|---|
| CN | 101673146 | 3/2010 |
| TW | 445415 | 7/2001 |
| TW | 200847888 | 12/2008 |

OTHER PUBLICATIONS

Acme Dual screen LCD KVM (Model Number: SMK120 / SMK220) p. 1 and 2 were downloaded from "http://www.acmeportable.com.tw/Multi-display.htm" on Oct. 2, 2009.

(Continued)

*Primary Examiner* — Tadeese Hailu
(74) *Attorney, Agent, or Firm* — Chen Yoshimura LLP

(57) ABSTRACT

An equipment for controlling a plurality of computers and the operating method thereof are provided. The equipment electrically connects to a Liquid Crystal Display (LCD) module and a touch LCD module and a plurality of computer respectively, where the LCD module receives and displays an image of one of the plurality of computers, the touch LCD module displays an imaging inputting interface and at least one of the images corresponding to the plurality of computers, and the imaging inputting interface receives a command to control the specific computer.

19 Claims, 13 Drawing Sheets

(56) References Cited

OTHER PUBLICATIONS

Chinese Office Action, dated Jul. 20, 2012, in a counterpart Chinese patent application, No. CN 201010157994.X.

Taiwanese Office Action, dated Feb. 5, 2013, in a counterpart Taiwanese patent application, No. TW 099107017.

* cited by examiner

EQUIPMENT WITH DUAL SCREENS FOR CONTROLLING MULTI-COMPUTERS AND THE OPERATING METHOD THEREOF

BACKGROUND OF THE INVENTION

1. Field of the Invention

This invention relates to a dual-screen multi-computer control system and its management methods, and in particular, it relates to a multi-computer management device having a regular display screen and a touch-control display screen, and through the touch-control display screen controlling the computers connected to the multi-computer management system.

2. Description of the Related Art

Conventional keyboard-video-mouse (KVM) switches currently on the market are often equipped with a user interface that typically includes a liquid-crystal display (LCD) screen combined with a fixed keyboard. When it is necessary for operations that need two independent LCD display screens, there are two approaches as follows:

(1) Dividing the original one LCD screen into two smaller independent LCD screens; or (2) Connecting another LCD screen on the side of the original LCD screen such that the other LCD screen can be flipped to use in addition to the original LCD screen.

However there are drawbacks for the either of these approaches described above. For the first approach, the original one LCD screen is divided into two smaller independent LCD screens, which makes the operation window of each of the independently divided LCD screens much smaller, and is more likely to cause visual confusion to the user in operation. For the second approach, the other LCD screen has its own thickness, such that after the interface of the KVM switch having two LCD monitors is received in a rack, it will make the already small rack space more crowded. In addition, this interface arrangement also requires much wider space for flipping the LCD screens and it is not easy to use because the flipped width is much wider than the rack width.

SUMMARY OF THE INVENTION

To increase the efficiency of management and possibility of expansion of the user interface operation device of the KVM switch, the inventor after repeated deliberation has introduced the present invention dual-screen multi-computer management system and management method. The present invention provides a touch control display screen as a secondary screen, and displaying on the touch control display screen a simulated input interface to replace conventional fixed keyboard, to provide users with greater viewing area without requiring extra hardware space.

In addition, not only the simulated input interface but also other subjects such as the monitoring and control images of multiple computers, user interface or shortcut bar of the KVM switch, etc., can be displayed on the touch control display screen. Moreover, if more input interfaces are needed to operate more advanced functions of KVM switches in the future, the added input interface can be directly displayed/simulated on the touch control display screen, thereby reduces the design complicity of arranging corresponding hardware buttons and the rack space needed and the costs incurred. Therefore, the touch control display screen provides great expansion flexibility and can be easily adapted to more powerful KVM switches.

To achieve the above object, the present invention provides a multi-computer management system. The multi-computer management system includes a multi-computer management device, a display module and a touch-control display module, wherein the multi-computer management device is electrically coupled with a plurality of computers. The plurality of computers include a first computer and a second computer, the first computer and the second computer having a first image and a second image respectively. The multi-computer management device receives the first image and the second image. The display module is electrically coupled to the multi-computer management device to receive the first image from the multi-computers management device and display the first image. The touch control display module is electrically coupled to the multi-computer management device to receive the second image from the multi-computers management device and display the second image. The touch control display module also displays a simulated input interface which is used to receive a first external instruction to operate the first computer through the multi-computer management device.

Again to achieve the above object, the present invention also provides a multi-computer management device. The multi-computer management device includes multiple computer interfaces, a first display interface, a second display interface and a processing unit, wherein the multiple computer interfaces are electrically coupled to a plurality of computers respectively. The plurality of computers include a first computer and a second computer, the first computer and the second computer having a first image and a second image respectively. A first computer interface and a second computer interface of the multiple computer interfaces are used to receive the first image and the second image respectively. The first computer interface is used to output a first external instruction to the first computer. The first display interface is electrically coupled to a display module to display the first image. The second display interface is electrically coupled to a touch control display module to display a simulated input interface, which simulated input interface is used to receive the first external instruction. The processing unit is electrically coupled to the computer interfaces, the first display interface, the second display interface, to cause the first external instruction, the first image and the second image to be transmitted between the first computer, the second computer, the display module and the touch control display module. The processing unit is also provided to execute the first external instruction to operate the first computer.

Still to achieve the above object, the present invention further provides a multi-computer management method, which includes the following steps: providing a multi-computer management device which is electrically coupled to a plurality of computers including a first computer and a second computer, the first computer and the second computer have a first image and a second image respectively, where the multi-computer management device is used to receive the first image and the second image respectively; providing a display module and a touch control display module, which display module and touch control display module are electrically coupled to the multi-computer management device, where the touch control display module displays a simulated input interface; receiving the first image from the multi-computer management device through the display module and displaying the first image on the display module; receiving the second image from the multi-computer management device through the touch control display module and displaying the second image on the touch control display module; receiving a first external instruction through the simulated input interface to operate the first computer through the multi-computer management device.

To make the above described invention easier to understand, a preferred embodiment is described below in detail, in conjunction with the appended drawings.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

It is to be understood that both the foregoing general description and the following detailed description are exemplary and explanatory and are intended to provide further explanation of the invention as claimed.

DETAILED DESCRIPTION OF THE PREFERRED EMBODIMENTS

As required, a detailed illustrative embodiment of the present invention is disclosed herein. However, techniques, systems and operating structures in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein, which define the scope of the present invention. The following presents a detailed description of the preferred embodiment (as well as some alternative embodiments) of the present invention.

Figure 1:
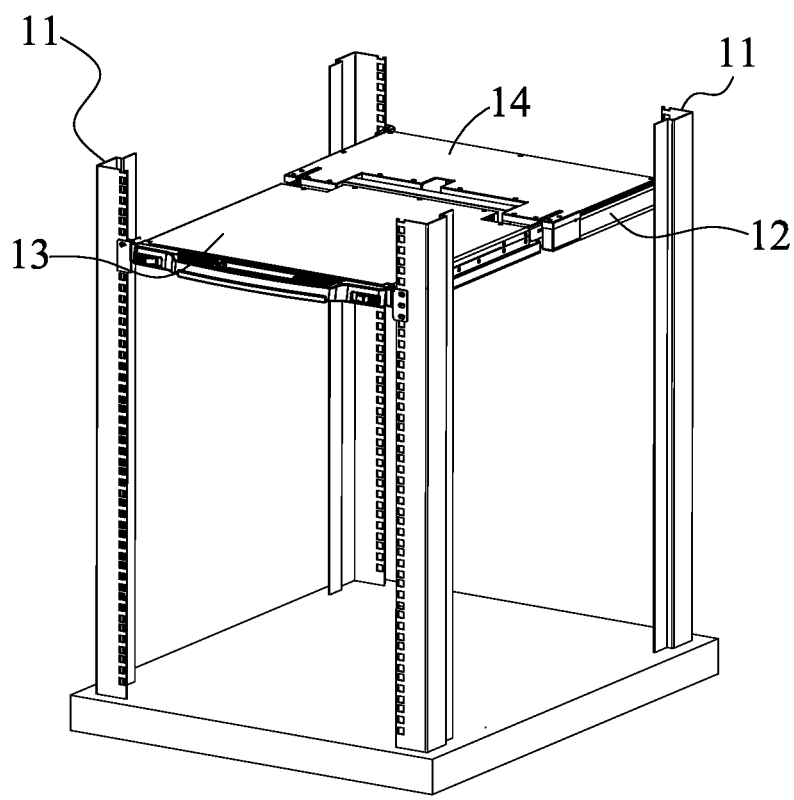
FIG. 1 is a diagram illustrating the rack structure of a multi-computer management device having a dual-screen user interface according to one embodiment of the present invention.

Referring to FIG. 1, there is shown a diagram illustrating the rack structure of a multi-computer management device having a dual-screen user interface according to one embodiment of the present invention. As shown in FIG. 1, the multi-computer management system 10 includes a rack 11, an extension mechanism 12, a user interface operation module 13, and a multi-computer management device 14. By way of present embodiment, the multi-computer management device 14 may be a KVM switch. The multi-computer management device 14 is electrically coupled to a plurality of computers and the user interface operation module 13, such that any one of the plurality of computers can be controlled by the user interface operation module 13 through the multi-computer management device 14, just as the user interface operation module 13 is directly electrically coupled to and controls any one of the plurality of computers.

Also as shown in FIG. 1, the extension mechanism 12 is mounted on rack 11 which has a front end and a back end. The user interface operation module 13 is positioned at the front end and the multi-computer management device 14 is positioned at the back end. The extension mechanism 12 is connected with the user interface operation module 13 and the multi-computer management device 14 to move the user interface operation module 13 and the multi-computer management device 14 back and forth, whereby the user interface operation module 13 and the multi-computer management device 14 can be in and out of the rack 11. In addition, depending on the need, the extension mechanism 12 may utilize slide rails, telescopic rods and/or other extendable mechanisms, where the sliding members of the slide rails may be arranged horizontally or vertically depending on the needs. The slide rails may also be a two-segment or triple-segment design.

Figure 2:
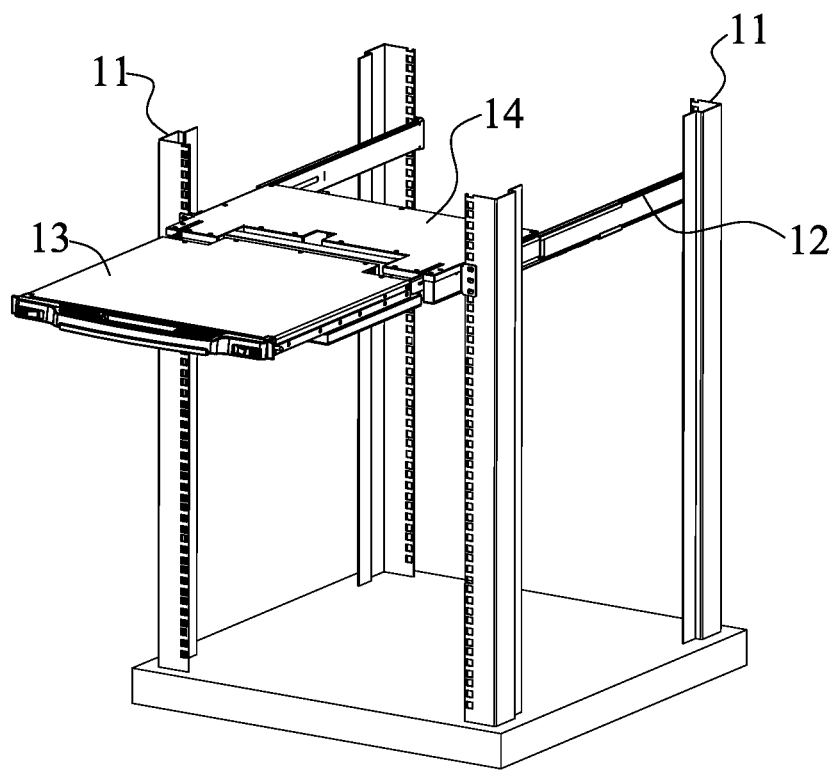
FIG. 2 is a diagram illustrating the extension mechanism of the rack structure of the multi-computer management device having a dual-screen user interface shown in FIG. 1.

Referring to FIG. 2, there is shown a diagram illustrating the extension mechanism of the rack structure shown in FIG. 1. In FIG. 2, it is clearly shown that the user interface operation module 13 and the multi-computer management device 14 are laterally moved by the extension mechanism 12 along a direction of movement to the outside of the rack 11, such that the user interface operation module 13 and the multi-computer management device 14 located at an extended position. Nonetheless, depending on the user's needs, the multi-computer management device 14 of the present invention may also be fixed at the back end of the rack 11 and not connected with the extension mechanism 12, such that when the user interface operation module 13 is laterally moved by the extension mechanism 12 to the outside of the rack 11, the multi-computer management device 14 is still fixed on the rack 11 at the back-end without being moved at the same time to outside of the rack 11, where the user interface operation module 13 can be electrically coupled to the multi-computer management device 14 by flexible wires or cables.

Figure 3:
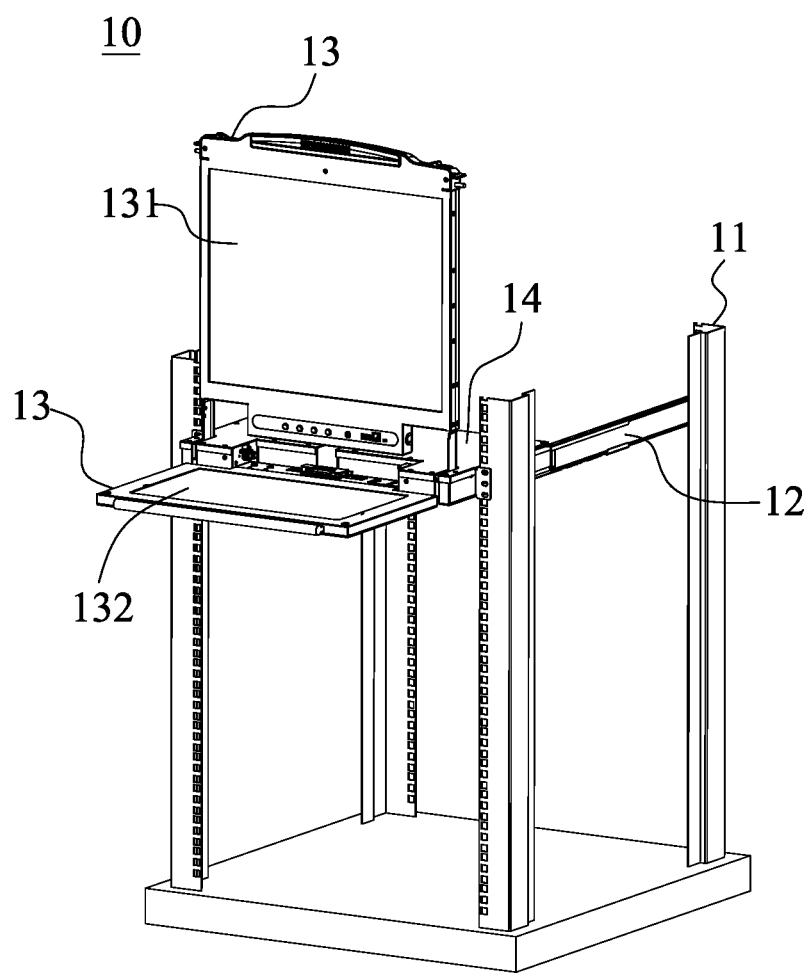
FIG. 3 is a diagram illustrating the supporting mechanism of the rack structure of the multi-computer management device having a dual-screen user interface shown in FIG. 1.

Referring to FIG. 3, there is shown a diagram illustrating one position of the user interface operation module 13 at its extended position as shown in FIG. 2. In FIG. 3, the user interface operation module 13 is in a flipped open position. More particularly, the user interface operation module 13 includes a display module 131 and a touch control display module 132. In FIG. 1, when the user interface operation module 13 is located inside the rack 11, the display module 131 is flipped down/closed on top of the touch control display module 132, while in FIG. 3, the display module 131 is flipped up/open from the touch control display module 132 with an angle of display, which can be adjusted depending on the user's needs, but normally is not less than 90 degrees and not more than 180 degrees. In addition, display module 131 may be replaced by another touch control display module based on the user's needs. In the embodiment of the present invention, the rotational axis of the display module 131 and touch control display module 132 are parallel or aligned to each other. The rotation axis is perpendicular to the laterally moving direction and parallel to the front end or back end of the rack.

Figure 4:
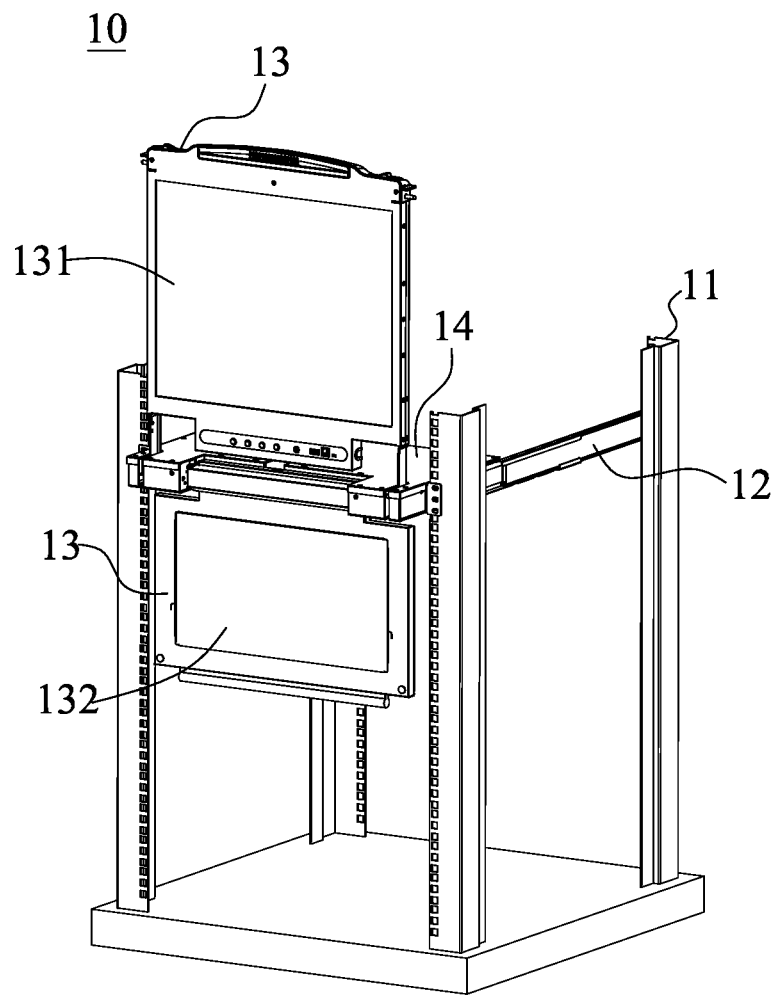
FIG. 4 is a diagram illustrating another positioning configuration of the multi-computer management device having a dual-screen user interface shown in FIG. 1.

Referring to FIG. 4, there is shown a diagram illustrating another position of the user interface operation module 13 at its extended position as shown in FIG. 2. In FIG. 4, there is shown a positioning where the display module 131 is flipped up/open from the touch control display module 132 with an angle of 180 degrees. In particular, after the display module 131 is flipped up/open from the touch control display module 132 with an angle as shown in FIG. 3, the touch control display module 132 can be further flipped down in an opposite direction away from the display module 131, such that the display module 131 and the touch control display module 132 are positioned as shown in FIG. 4. Therefore, from FIGS. 3 and 4, it is shown that the angle between the present invention display module 131 and touch control display module 132 can be freely adjusted depending on the user's needs to accommodate different situations.

Figure 5A:
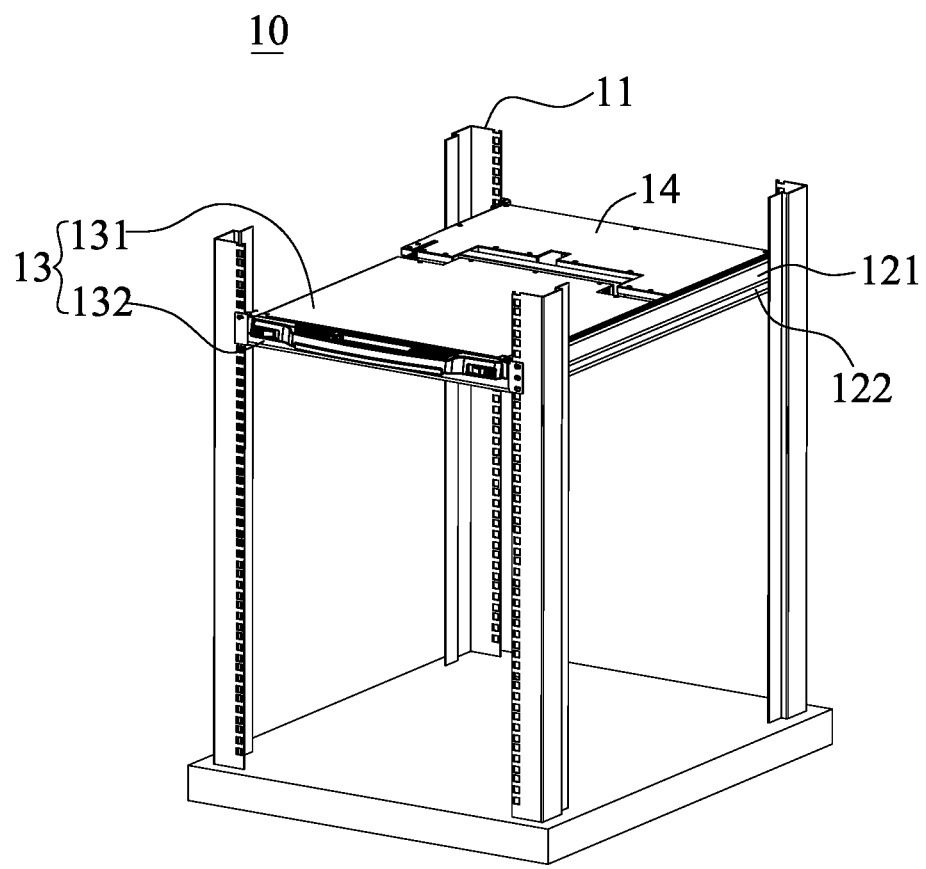
FIG. 5A is a diagram illustrating the rack structure of a multi-computer management device having a dual-screen user interface according to another embodiment of the present invention.

Referring to FIG. 5A, there is shown a diagram illustrating another embodiment of the present invention user interface operation module 13. In FIG. 5A, the multi-computer management system 10 includes rack 11, a first extension mechanism 121, a second extension mechanism 122, multi-computer management device 14, display module 131 and touch control display module 132, where the first and second extension mechanisms 121 and 122 are respectively connected to display module 131 and touch control display module 132 separately to move display module 131 and the touch control display module 132 independently back and forth in and out of rack 11. In addition, the first extension mechanism 121 and the second extension mechanism 122 may be arranged in parallel or perpendicular to each other.

Figure 5B:
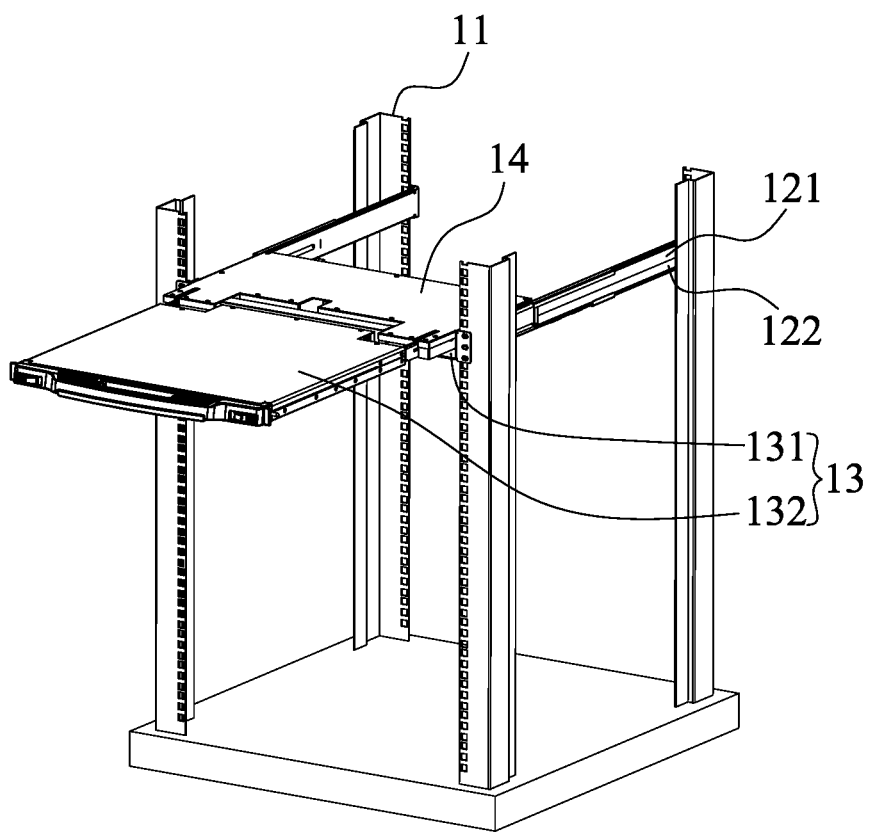
FIG. 5B is a diagram illustrating the extension mechanism of the rack structure of the multi-computer management device having a dual-screen user interface shown in FIG. 5A.
Figure 5C:
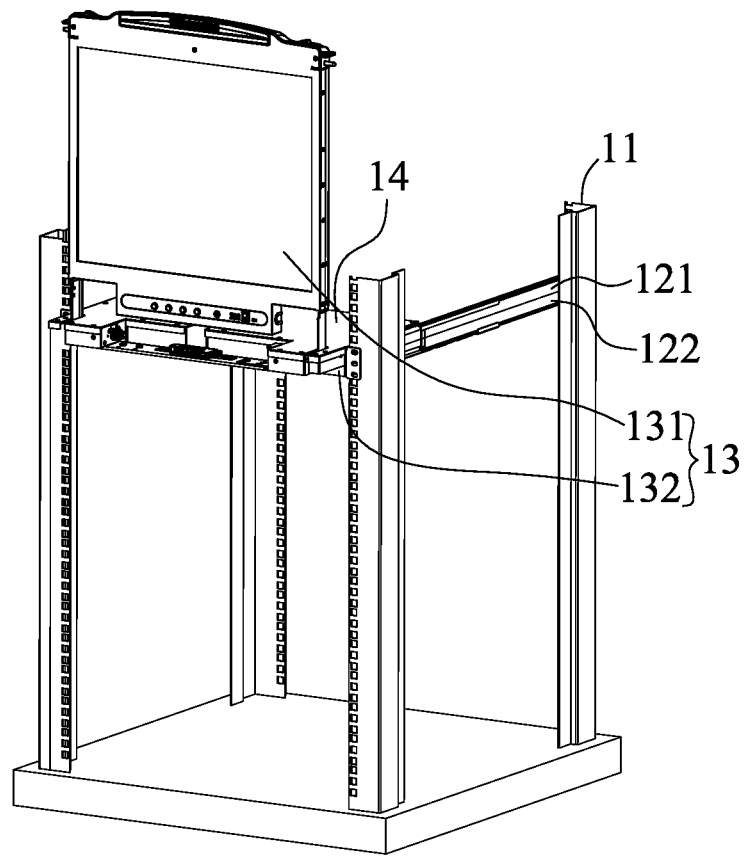
FIG. 5C is a diagram illustrating the supporting mechanism of the rack structure of the multi-computer management device having a dual-screen user interface shown in FIG. 5A.
Figure 5D:
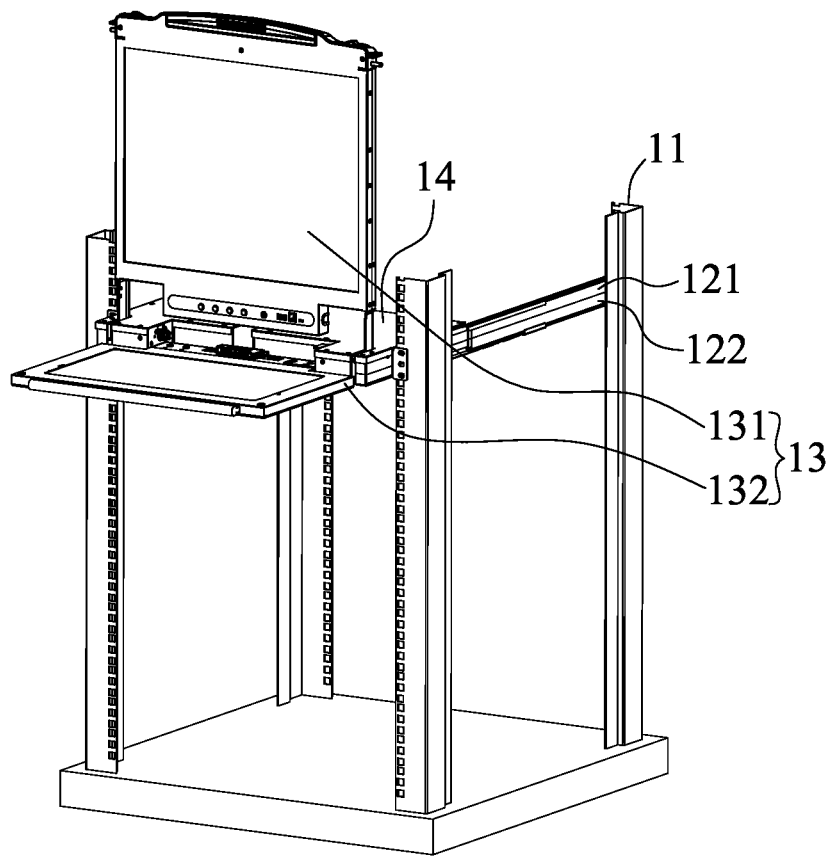
FIG. 5D is a diagram illustrating another positioning configuration of the multi-computer management device having a dual-screen user interface shown in FIG. 5A.

Referring to FIGS. 5B, 5C and 5D, there are illustrated the various positions of the user interface operation module 13 as shown in FIG. 5A. As shown in FIGS. 5B and 5C, display module 131 can be moved by the first extension mechanism 121 to the outside of the rack 11, independent of the touch control display module 132, and then flipped up/open into a working position, whereas shown in FIG. 5D, the touch control display module 132 may then be moved by the second extension mechanism 122 to the outside of the rack 11 so that it can be used by a user to input instructions, where the touch control display module 132 can also be further flipped down into a position shown in FIG. 4.

Figure 6A:
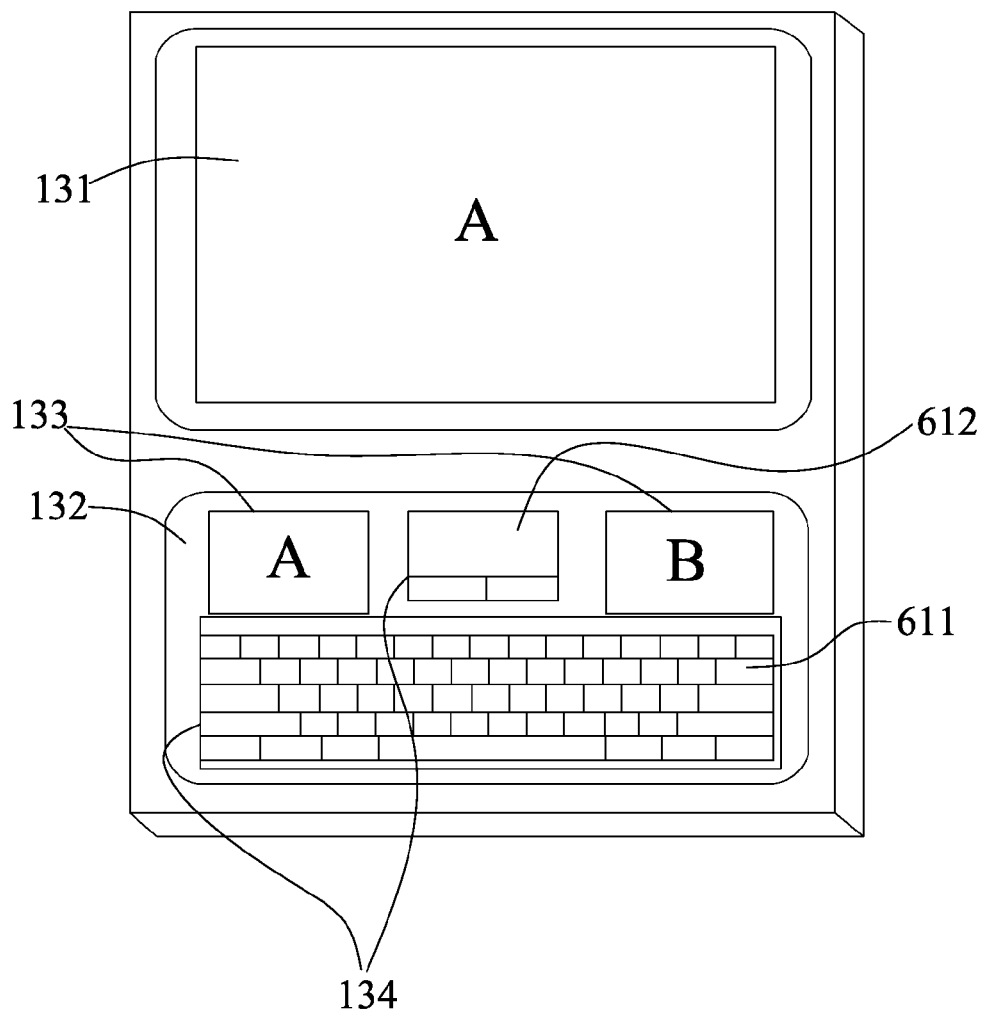
FIG. 6A is a diagram illustrating one control operation mode of the user interface of the present invention.

Referring to FIG. 6A, there is shown a diagram illustrating one operation mode of the display module 131 and the touch control display module 132 of the user interface operation module 13. In FIG. 6A, the user interface operation module 13 is electrically coupled to the multi-computer management device 14 (not shown) and the plurality of computers (not shown), where the display module 131 receives a first image A of a first computer of the plurality of computers through the multi-computer management device 14 and displays the first image A on its display screen. The display screen of the touch control display module 132 is divided into a first display area 133 and a second display area 134. The touch control display module 132 is capable of displaying image representing at least one of the plurality computers. It is noted that the image displayed on the touch control display module 132 can be the outputted image such as desktop image of the corresponding computer, or simply a represented icon image. In the present embodiment, the touch control display module 132 receives the first image A of the first computer and a second image B of a second computer of the multiple of computers through the multi-computer management device 14, and displays the first image A and the second image B in the first display area 133. The touch control display module 132 also displays a graphical keyboard 611 and a graphical touch panel 612 in the second display area 134. In addition to the graphical keyboard 611 and graphical touch panels 612, the touch control display module 132 may also display a graphical touch pad, a graphical control bar, a simulated hand-writing input pad, or any combination thereof.

In FIG. 6A, through the graphical keyboard 611 and/or the graphical touch panel 612, a user can enter a first external instruction to control the first computer, where the actual operation image of the first computer (i.e., the first image A) is displayed in the first display area 131. Moreover, since the touch control display module 132 simultaneously displays both the first image A and second image B, the user can monitor the second computer while control the first computer, such that the user may switch to the second computer as the operation computer at any time through the multi-computer management device 14.

For example, switching the operation computer to the second computer may be accomplished by inputting a second external instruction, which may be inputted through the graphical keyboard 611 such as defined hot key, and/or the graphical touch panel 612, or simply by touching the second image B displayed. Depending on the user's needs, the touch control display module 132 may simultaneously display the second image B and a third image C of a third computer of the multiple of computers, a fourth image D of a fourth computer of the multiple of computers, a fifth image E of a fifth computer of the multiple of computers, . . . , or through the switching instruction switch the second image B displayed on the touch control display module 132 to any one of the third image C, the fourth image D, the fifth image E . . . or any combination thereof.

Figure 6B:
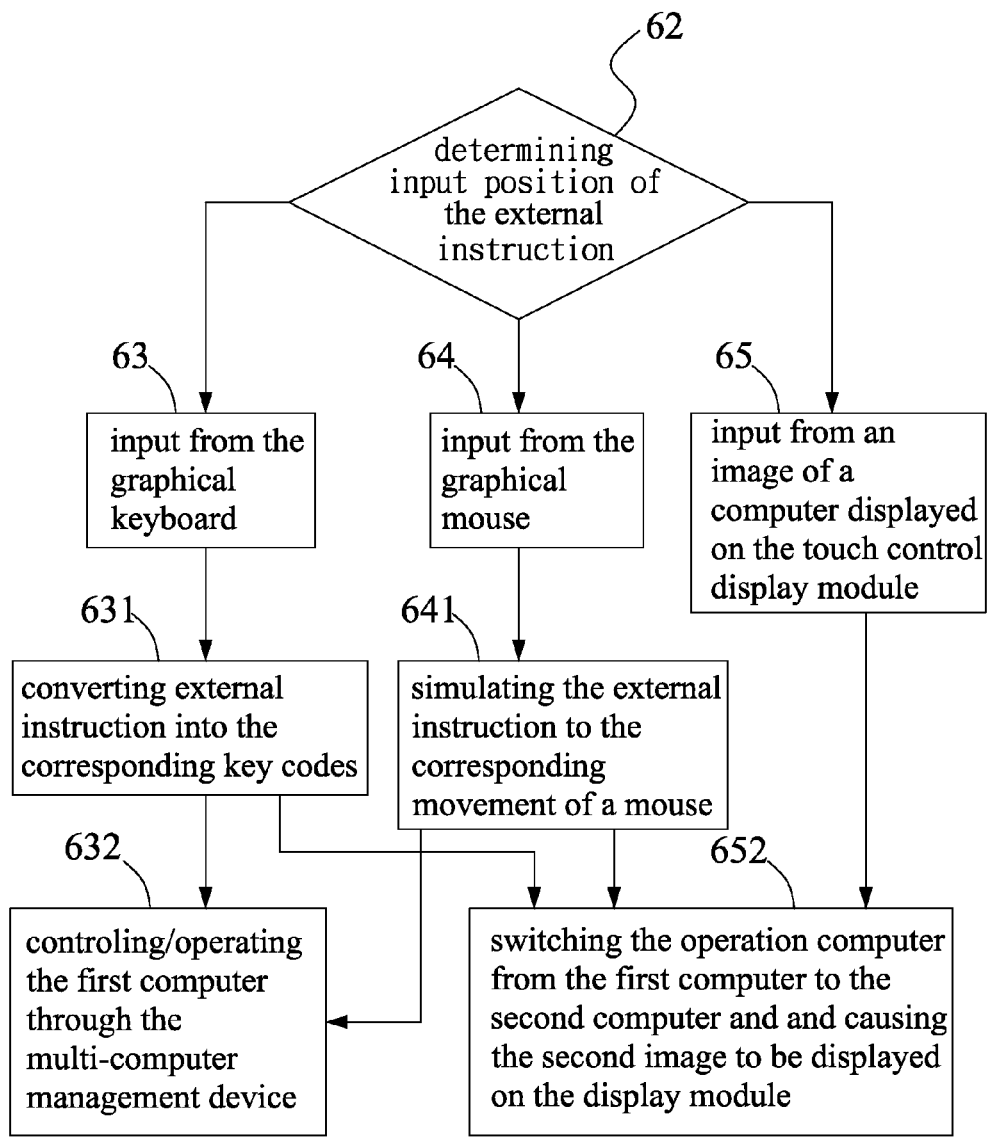
FIG. 6B is a flow chart illustrating the process of the control operation shown in FIG. 6A.

Referring to FIG. 6B, there is shown a flow chart illustrating the process of the control operation shown in FIG. 6A. As shown in FIG. 6B, when the touch control display module 132 receives an external instruction, first the input position of the external instruction is determined and confirmed (Step 62). When the external instruction is recognized to be input from the graphical keyboard 611 (Result 63), the external instruction will be converted into the corresponding key codes (Step 631). The corresponding key codes are input to the first computer of the plurality of computers through the multi-computer management device 14, in order to control/operate the first computer (Step 632). If the external instruction is recognized to be input from the graphical mouse (Result 64), the external instruction will be converted to simulate the corresponding movement of a mouse (Step 641). The corresponding movements of the mouse are input to the first computer of the plurality of computers through the multi-computer management device 14, in order to control/operate the first computer (Step 632).

In addition, as shown in FIG. 6B, if the external instruction is recognized as to be input at an image of a computer displayed on the touch control display module 132 (not the image of the computer currently being controlled displayed on the display module 131) (Result 65), the multi-computer management device 14 will switch the computer currently being controlled to the computer corresponding to the computer image displayed at the input position, and then display the image of the switched-to computer on the display module

131. For example, when the input position of an external instruction is recognized and confirmed to be at the second image B, the multi-computer management device 14 will switch the operation computer from the first computer to the second computer, and cause the second image B to be displayed on the display module 131, to complete the switching action (Step 652).

Still referring to FIG. 6B, in another practical embodiment, when a user wants to switch operation computer, the user may also input an external instruction through the graphical keyboard 611 or graphical mouse 612, such that after steps 631 or 641 the external instruction is executed by the multi-computer management device 14 to switch the current operation computer from the first computer to the second computer and cause the second image B to be displayed on the display module 131, to complete the switching action (i.e., to perform the actions of Step 652).

Figure 7:
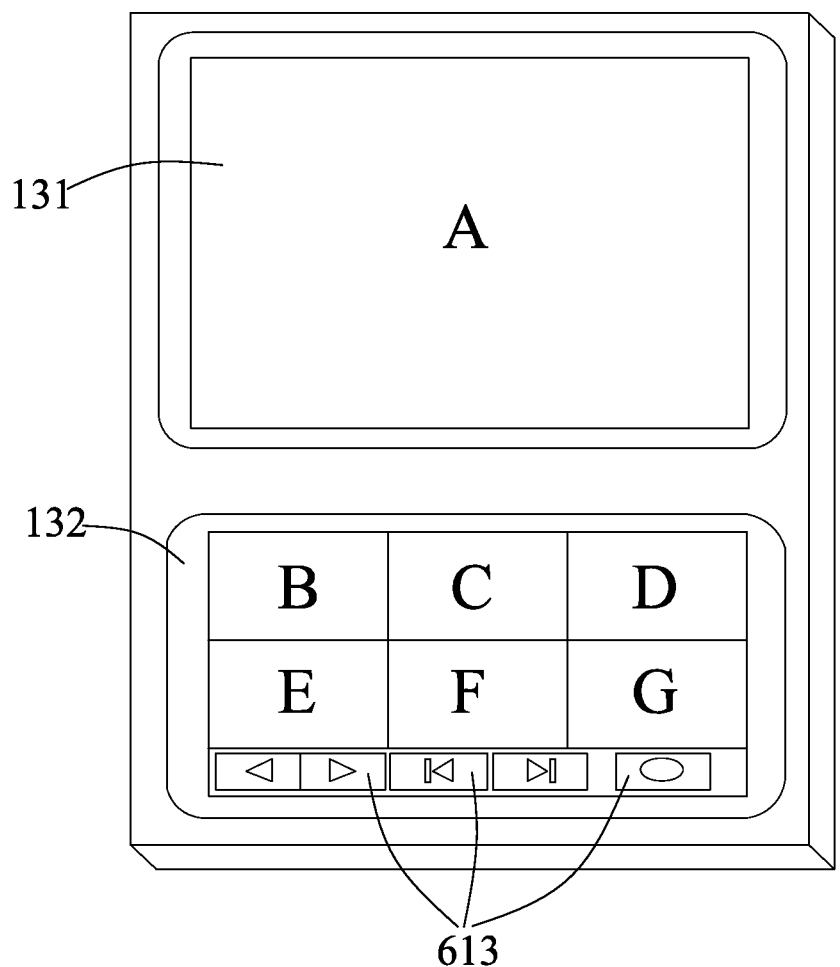
FIG. 7 is a diagram illustrating another control operation mode of the user interface of the present invention.

Referring to FIG. 7, there is shown a diagram illustrating another operation mode of the display module 131 and the touch control display module 132 of the user interface operation module 13. In FIG. 7, user interface operation module 13 is still electrically coupled to the multi-computer management device 14 (not shown) and the plurality of computers (not shown). Through the multi-computer management device 14, the display module 131 receives and displays a first image A of a first computer of the plurality of computers, and touch control display module 132 and displays a second icon image B, a third icon image C, a fourth icon image D, a fifth icon image E, and sixth icon image F and a seventh icon image E of the corresponding second, third, fourth, fifth, sixth and seventh computers of the plurality of computers, and the touch control display module 132 further displays a graphical control bar 613, to control the multi-computer management device 14. It is noted that the icon image displayed on the touch control display module can be the outputted image such as desktop image from the corresponding computer, or simply a represented pattern or picture image representing the corresponding computer.

Through the operation mode shown in FIG. 7, a user can simultaneously monitor the second through the seventh computers, and can touch-select any one of the icon images B, C, D, E, F and G to switch the operation computer to the computer corresponding to the selected icon image and cause the display module 131 to display the image output from the switched-to computer. Alternatively, the user may use the graphical control bar 613 to input a switching instruction to switch the operation computer, or replace the second through the seventh images B, C, D, E, F and G to the eighth through the thirteenth images H, I, J, K, L and M, in order to monitor the status of the eighth through the thirteen computers, or perform further switching actions. In addition, the graphical control bar 613 may be replaced by a control window if needed.

Referring to FIGS. 6A and 7 together, the respective operation modes shown in FIGS. 6A and 7 can be freely switched therebetween. For example, a user may first monitor the plurality of computers through the operation mode shown on FIG. 7, and then switches the operation mode to the one shown in FIG. 6A, to operate the computer whose corresponding image is shown in the display module 131.

Figure 8:
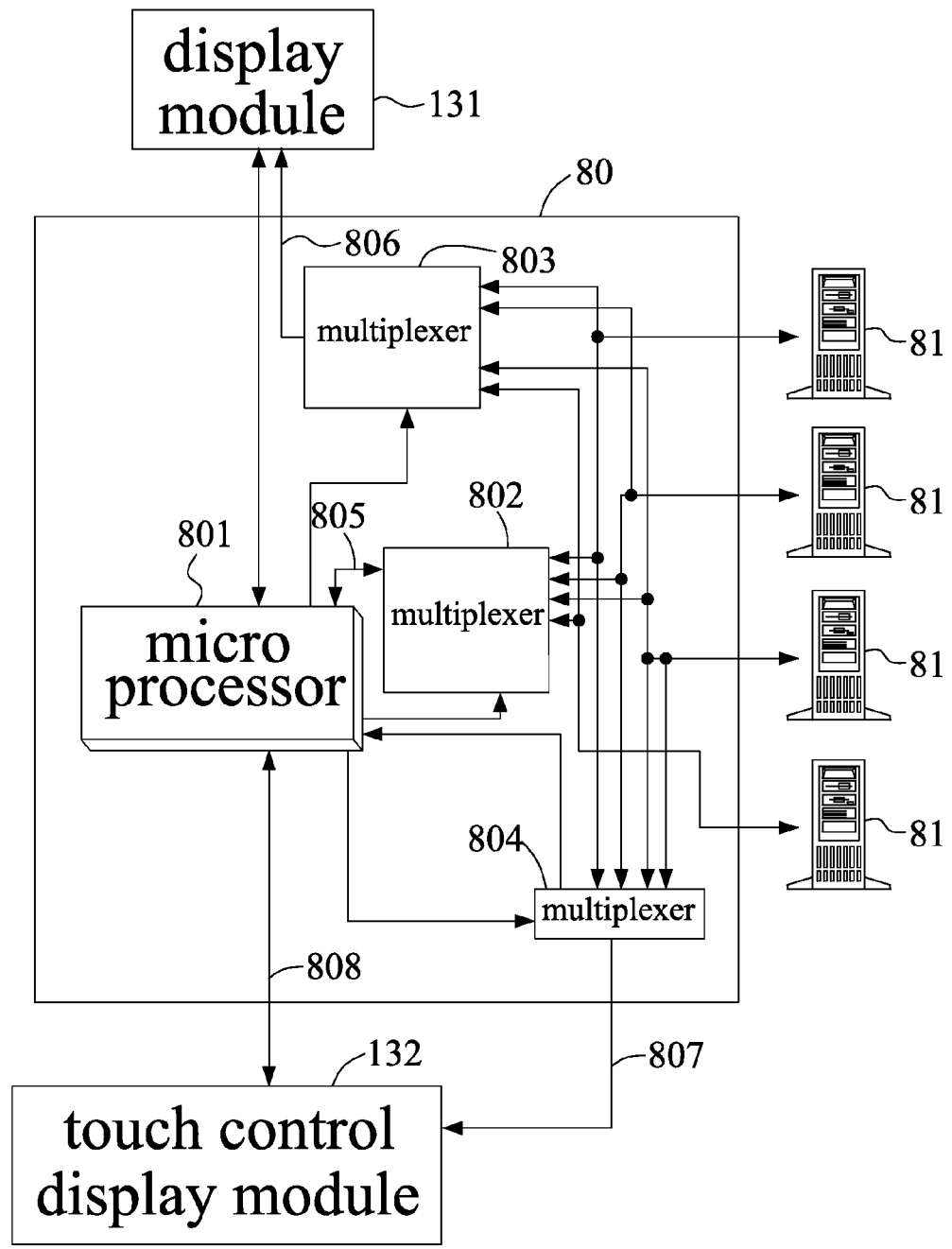
FIG. 8 is a block diagram illustrating the control module of the present invention multi-computer management device.

Referring to FIG. 8, there is shown a block diagram illustrating the control module of the present invention multi-computer management device. As shown in FIG. 8, the control module 80 is electrically coupled with the plurality of computers 81 respectively. The control module 80 includes a microprocessor 801 and multiplexer 802, 803 and 804. The multiplexers 802, 803 and 804 are electrically coupled with microprocessor 801 and the plurality of computers 81 respectively, where multiplexer 802 is used to receive data 805 of the plurality of computers 81 and transmit the data to microprocessor 801. The multiplexer 802 is also used to receive commands from the microprocessor 801 and transmit the commands to the plurality of computers 81. In addition, the multiplexers 803 and 804 are electrically coupled to display module 131 and touch control display module 132 respectively, and are used to receive image output 806 and 807 from the plurality of computers 81 and transmit image output 806 and 807 to display module 131 and touch control display module 132 respectively for displaying the images on display module 131 and touch control display module 132 respectively.

When a user inputs an external instruction through touch control display module 132, the external instruction is converted into an input signal 808 and transmitted to the microprocessor 801 to be processed by the microprocessor 801, such that the microprocessor 801 may execute corresponding actions in accordance with the external instruction represented by the input signal 808, such as the actions described herein, for example switching the operation computer between the plurality of computers 81, operating on any one of the plurality of computers 81, or changing the operation mode, etc.

Figure 9:
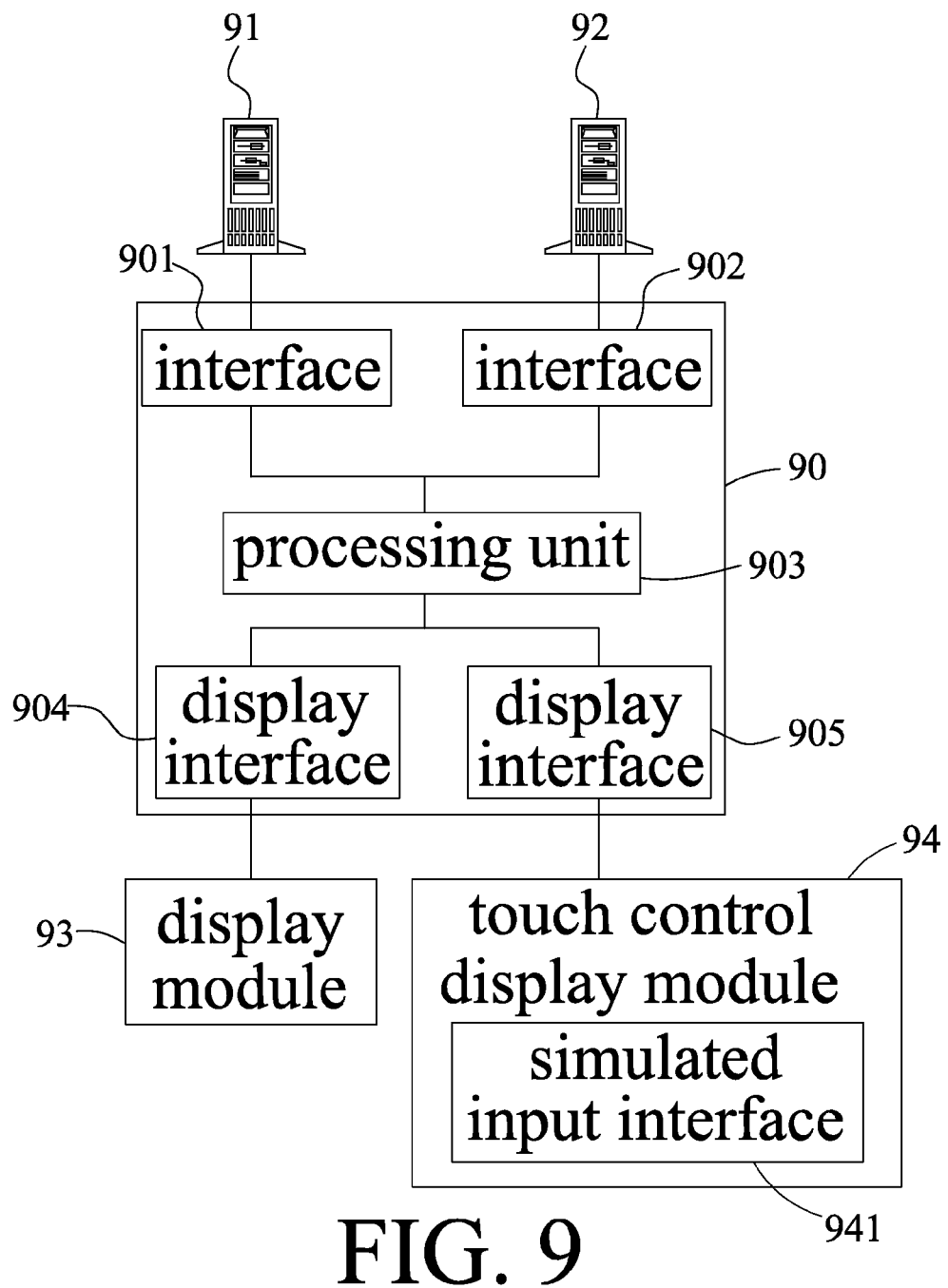
FIG. 9 is a block diagram illustrating the connection of the present invention multi-computer management device.

Referring to FIG. 9, there is shown a block diagram illustrating the connection relationship of the present invention multi-computer management device. As shown in FIG. 9, the multi-computer management device 90 has interfaces 901 and 902, a processing unit 903, and display interfaces 904 and 905, where processing unit 903 is electrically coupled to interfaces 901 and 902, and display interfaces 904 and 905 respectively. The interfaces 901 and 902 may be PS/2, USB, HDMI, HDB, SPHD, HPDB, D-SUB, DVI, network socket (e.g. RJ-45), or wireless interface, etc. Moreover, the interfaces 901 and 902 are electrically coupled to computers 91 and 92 respectively, such that interfaces 901 and 902 can receive images from computers 91 and 92 respectively, and allows the processing unit 903 to control computer 91 and 92 respectively, or any one of them. Display interface 904 is electrically coupled to display module 93 to display the image of computer 91 or 92. Touch control display interface 905 is electrically coupled to touch control display module 94, where the touch control display module 94 displays simulated input interface 941 for receiving external instructions.

When a user inputs a first instruction through simulated input interface 941, the processing unit 903 will receive the first instruction and control computer 91 through the interface 901, while the user can monitor the execution of the first instruction through the image of the computer 91 displayed on the display module 93. In addition, a user can input a second instruction through simulated input interface 941, to cause the multi-computer management device 90 to switch the operation computer from computer 91 to computer 92. After the switching, display module 93 will be switched to display the image of computer 92, such that the user may input a third instruction through simulated input interface 941, to control the computer 92 through the processing unit 903 and interface 902 and further monitor the execution of the third instruction through the image of the computer 92 displayed on the display module 93.

From the above description it can be seen that the prevent invention replaces the conventional fixed keyboard with a simulated input interface displayed on the touch control display module, thereby not only reduces the trouble of stocking fixed keyboards and spaces occupied by the hardware of the multi-computer management equipment, but also increases the displaying area of the user interface operation module so that more computers may be monitored without interfering with the main display (i.e., the image displayed by the display module) and system operation. In addition, the simulated input interface may be switched as needed between multiple display interface modes or simultaneously displayed to provide more suitable or intuitive input methods and present a more user-friendly operation interface. Furthermore, new display interface or graphical keys can be freely added to the touch control display module, which makes it easily expandable to perform more advanced functions of multi-computer management devices and reduces complexity in system design.

Moreover, when the simulated input interface includes a graphical keyboard, the graphical keyboard can be switched between input methods for languages of different countries, so that when the manufacturer ships its products to a different country, it only needs to switch the input method of the graphical keyboard for the languages of that country through software, thereby completely solving the problems of having to stock or assemble keyboards for different languages.

Although examples of the preferred embodiments of the present invention system and method are shown and described in detail above, the present invention is not limited to the specifics described herein. It will be apparent to those skilled in the art that various modification and variations can be made in the system and method of the present invention without departing from the spirit or scope of the invention. Thus, it is intended that the present invention cover modifications and variations that come within the scope of the appended claims and their equivalents.

What is claimed is:

1. A multi-computer management system, comprising:
a plurality of computers, each computer providing an image;
a user interface operation module comprising a display module, and a touch control display module for displaying a simulated input interface which is used to receive a first external instruction;
a multi-computer management device electrically coupled to the plurality of computers for receiving the image of each computer, and to the display module and the touch control display module, the multi-computer management device outputting an image from a first computer of the plurality computers to the display module by a computer switch action, and receiving and transmitting the first external instruction to operate the first computer as an operation computer corresponding to the computer switch action;
the display module displaying the image from the first computer while the touch control display module displaying at least one representing image representing other computers of the plurality of computers; and
upon receiving a second external instruction at said touch control display module selecting one of the at least one representing image of a second computer of the plurality of computers, the multi-computer management device switching to the second computer corresponding to the selected representing image as the operation computer, and switching the display module from displaying the image from the first computer to displaying the image from the second computer.

2. The system of claim 1, further comprising:
a rack having a front end and a back end, where the multi-computer management device is mounted at the back end; and
an extension mechanism mounted on the rack and coupled to the user interface operation module for moving the user interface operation module in and out of the rack, wherein when the user interface operation module is inside the rack, the display module is flipped close on the touch control display module, whereas when the user interface operation module is moved outside of the rack, the display module is flipped open from the touch control display module in an angle of display.

3. The system of claim 1, further comprising a rack having a front end and a back end, where the multi-computer management device is mounted at the back end, and at least one of the display module and the touch control display module is mounted at the front end, and at least one of the display module and the touch control display module can flip around at the front end.

4. The system of claim 1, further comprising:
a rack; and
an extension mechanism mounted on the rack and coupled to the user interface operation module and the multi-computer management device for moving the user interface operation module and multi-computer management device in and out of the rack, wherein when the user interface operation module is inside the rack, the display module is flipped close on the touch control display module, whereas when the user interface operation module is moved outside of the rack, the display module is flipped open from the touch control display module in an angle of display.

5. The system of claim 1, further comprising:
a rack having a front end and a back end, where the multi-computer management device is mounted at the back end; and
a first extension mechanism and a second extension mechanism arranged in parallel or perpendicular to each other;
the first extension mechanism mounted on the rack and coupled to the touch control display module for moving the touch control display module in and out of the rack;
the second extension mechanism mounted on the rack and coupled to the display module for moving the display module in and out of the rack; and
wherein the touch control display module and the display module can independently flip around outside of the front end of the rack.

6. The system of claim 1, wherein the at least one representing image from other computers of the plurality of computers displayed on the touch control display module is an icon image corresponding to one of the other computers of the plurality of computers.

7. The system of claim 1, wherein the representing image is an outputted image provided by the corresponding computer, and the multi-computer management device transmits at least one of the outputted images respectively corresponding to at least one of the plurality of computers to the touch control display module.

8. A multi-computer management device, comprising:
a plurality of computer interfaces electrically coupled to a plurality of computers respectively, each computer generating an image;
a first display interface electrically coupled to a display module;
a second display interface electrically coupled to a touch control display module for displaying a simulated input interface which is used for receiving a first external instruction;
a control module electrically coupled to the plurality of computer interfaces, the first display interface and the second display interface for switching a first computer of the plurality of computers to output the corresponding image to the display module through the first display interface, and transmitting the first external instruction to operate the first computer as an operation computer through the computer interface coupled to the first computer;

the display module displaying the image from the first computer while the touch control display module displaying at least one representing image from other computers of the plurality of computers; and upon receiving a second external instruction at said touch control display module selecting one of the at least one representing image of a second computer of the plurality of computers, switching to the second computer corresponding to the selected representing image as the operation computer, and switching the display module from displaying the image from the first computer to displaying the image from the second computer.

9. The device of claim 8, further comprising:
a rack having a front end and a back end, where the multi-computer management device is mounted at the back end; and
an extension mechanism mounted on the rack and coupled to the display module and the touch control display module for moving the display module and the touch control display module in and out of the rack, wherein when the display module and the touch control display module are inside the rack, the display module is flipped close on the touch control display module, whereas when the display module and the touch control display module are moved outside of the rack, the display module is flipped open from the touch control display module in an angle of display.

10. The device of claim 8, further comprising:
a rack having a front end and a back end, where the multi-computer management device is mounted at the back end; and
a first extension mechanism and a second extension mechanism arranged in parallel or perpendicular to each other;
the first extension mechanism mounted on the rack and coupled to the touch control display module for moving the touch control display module in and out of the rack;
the second extension mechanism mounted on the rack and coupled to the display module for moving the display module in and out of the rack; and
wherein the touch control display module and the display module can independently flip around outside of the front end of the rack.

11. The device of claim 8, wherein the control module further transmits at least one of the image respectively corresponding to at least one of the plurality of computers to the touch control display module.

12. The device of claim 11, wherein the simulated input interface is also used for receiving a second external instruction to select one of the computer corresponding to the image displayed on the touch control display module, wherein the control module receives the second external instruction through the simulated input interface to execute a computer switch action, thereby switching the computer corresponding to the computer switch action to output the image to the display module.

13. The device of claim 8, wherein the control module further comprises:
a microprocessor;
a first multiplexer, electrically coupled to the microprocessor, the display module, and the plurality of computer interfaces for receiving the images of the plurality computers, the first multiplexer outputting the image of the switched computer to the display module; and
a second multiplexer, electrically coupled to the microprocessor, and the plurality of computer interfaces, the second multiplexer being used to receive a command corresponding to the first external instruction from the microprocessor and transmit the command to control the switched computer.

14. The device of claim 13, wherein the control module further comprises:
a third multiplexer, electrically coupled to the microprocessor, the touch control display module, and the plurality of computer interfaces for receiving the images of the plurality computers, the third multiplexer outputting at least one of the image respectively corresponding to at least one of the plurality of computers to the touch control display module.

15. The device of claim 8, wherein the at least one representing image from other computers of the plurality of computers displayed on the touch control display is an icon image corresponding to one of the other computers of the plurality of computers, or an outputted image corresponding to one of the other computers of the plurality of computers.

16. The device of claim 8, further comprising:
a rack; and
an extension mechanism mounted on the rack and coupled to the display module and the touch control display module and the multi-computer management device for moving the display module and the touch control display module, and multi-computer management device in and out of the rack, wherein when the display module and the touch control display module are inside the rack, the display module is flipped close on the touch control display module, whereas when the display module and the touch control display module are moved outside of the rack, the display module is flipped open from the touch control display module in an angle of display.

17. A multi-computer management method:
providing a multi-computer management device electrically coupled to a plurality of computers for receiving the plurality of images generated by the plurality of computers respectively;
providing a display module and a touch control display module electrically coupled to the multi-computer management device, wherein the display module receives an image from a first computer of the plurality of computers from the multi-computer management device while the touch control display module receives at least one image from other computers of the plurality of computers from the multi-computer management device;
receiving a first external instruction through a simulated input interface displayed on the touch control display module to operate the first computer as an operation computer through the multi-computer management device;
displaying on the display module the image from the first computer while displaying on the touch control display module at least one representing image from the other computers; and
upon receiving a second external instruction at said touch control display module selecting one of the at least one representing image of a second computer of the plurality of computers, switching to the second computer corresponding to the selected representing image as the operation computer, and switching the display module from displaying the image from the first computer to displaying the image from the second computer.

18. The method of claim 17, further comprising a step of receiving a second external instruction through the simulated input interface to execute a computer switching action, causing the display module to display the image of the computer corresponding to the computer switching action.

19. A method of claim 17, further comprising a step of touching one of the representing images displayed on the touch control display module to execute a computer switching action, causing the display module to display the image of the computer corresponding to the computer switching action.

* * * * *